(12) United States Patent
Mihailovic et al.

(10) Patent No.: US 11,756,609 B2
(45) Date of Patent: Sep. 12, 2023

(54) MEMORY DEVICE AND METHOD FOR ITS OPERATION

(71) Applicants: Jozef Stefan Institute, Ljubljana (SI); Center of Excellence on Nanoscience and Nanotechnology—Nanocenter, Ljubljana, Ljubljana (SI)

(72) Inventors: Dragan Mihailovic, Ljubljana (SI); Damjan Svetin, Ljubljana (SI); Anze Mraz, Ljubljana (SI); Rok Venturini, Ljubljana (SI)

(73) Assignees: Center of Excellence on Nanoscience and Nanotechnology—Nanocenter, Ljubljana (SI); Jozef Stefan Institute, Ljubljana (SI)

( * ) Notice: Subject to any disclaimer, the term of this patent is extended or adjusted under 35 U.S.C. 154(b) by 293 days.

(21) Appl. No.: 17/293,693

(22) PCT Filed: Nov. 14, 2019

(86) PCT No.: PCT/EP2019/081375
§ 371 (c)(1),
(2) Date: May 13, 2021

(87) PCT Pub. No.: WO2020/099584
PCT Pub. Date: May 22, 2020

(65) Prior Publication Data
US 2022/0005524 A1    Jan. 6, 2022

(30) Foreign Application Priority Data
Nov. 16, 2018    (GB) .................................... 1818713

(51) Int. Cl.
*G11C 16/04*    (2006.01)
*G11C 11/44*    (2006.01)
(Continued)

(52) U.S. Cl.
CPC ............. *G11C 11/44* (2013.01); *H10N 60/30* (2023.02); *H10N 70/253* (2023.02); *B82Y 10/00* (2013.01); *B82Y 25/00* (2013.01)

(58) Field of Classification Search
CPC .......... G11C 11/15; G11C 11/16; G11C 11/44
See application file for complete search history.

(56) References Cited

U.S. PATENT DOCUMENTS

| 4,275,314 A | 6/1981 | Fulton |
| 5,128,675 A | 7/1992 | Harada |
| (Continued) | | |

FOREIGN PATENT DOCUMENTS

| CN | 107819070 | 3/2018 |
| EP | 0218119 | 4/1987 |
| JP | S6178224 | 4/1986 |

OTHER PUBLICATIONS

Baek et al. (2014) "Hybrid superconducting-magnetic memory device using competing order parameters" Nature Communications, 5(3888): 1-6.
(Continued)

*Primary Examiner* — Pho M Luu
(74) *Attorney, Agent, or Firm* — Brian E. Davy; Bozicevic, Field & Francis LLP (57) ABSTRACT

The invention describes a memory device which combines a switchable resistive element and a superconductor element electrically in parallel. The switchable resistive element comprises an active material, which is switchable between first and second values of electrical resistivity $\rho_1$ and $\rho_2$ at the same temperature, wherein $\rho_1$ is different to $\rho_2$. The superconductor element is operable so that at least part of the superconductor element is switchable from a superconducting state to a non-superconducting state. When the superconductor element is switched from the superconducting state to the non-superconducting state, a current injection is (Continued)

provided through the switchable resistive element capable of switching the switchable resistive element between said first and second values of electrical resistivity.

17 Claims, 4 Drawing Sheets

(51) Int. Cl.
  *H10N 60/30* (2023.01)
  *H10N 70/20* (2023.01)
  *B82Y 10/00* (2011.01)
  *B82Y 25/00* (2011.01)

(56) References Cited

U.S. PATENT DOCUMENTS

| | | | | |
|---|---|---|---|---|
| 5,629,889 | A * | 5/1997 | Chandra | G11C 11/44 |
| | | | | 505/832 |
| 9,589,631 | B2 | 3/2017 | Stojcevska et al. | |
| 9,818,479 | B2 | 11/2017 | Vaskivskyi | |
| 10,923,646 | B2 * | 2/2021 | Dayton | H10N 60/35 |
| 10,984,857 | B2 * | 4/2021 | Najafi | H10N 60/83 |
| 2004/0160812 | A1 * | 8/2004 | Rinerson | H10N 70/043 |
| | | | | 365/158 |
| 2012/0302446 | A1 | 11/2012 | Ryazanov et al. | |
| 2016/0035404 | A1 | 2/2016 | Ohki et al. | |
| 2017/0069367 | A1 | 3/2017 | Ohki et al. | |

OTHER PUBLICATIONS

Baranov et al. (2013) "Dynamics of resistive state in thin superconducting channels" Physical review. B, Condensed matter 87(17):174516.

Brenner et al. (2012) "Dynamics of superconducting nanowires shunted with an external resistor" Phys. Rev. 85(22): 224507.

Buh et al. (2015) "Control of switching between metastable superconducting states in δ-MoN Nanowires" Nat Commun. 6(10250).

Gingrich et al. (2016) "Controllable 0-π Josephson junctions containing a ferromagnetic spin valve" Nature Physics, 12: 564-567.

Holmes et al. (2013) Energy-Efficient Superconducting Computing—Power Budgets and Requirements, IEEE transactions on Appl. Supercon. 23(3): 1701610.

Larkin et al. (2012) "Ferromagnetic Josephson switching device with high characteristic Voltage" Appl. Phys. Lett. 100: 222601.

Madan et al. (2018) Nonequilibrium optical control of dynamical states in superconducting nanowire circuits. Science Advances. 4(3): eaao0043.

McCaughan et al. (2014) "A Superconducting-Nanowire Three-Terminal Electrothermal Device" Nano Lett., 14(10): 5748-5753.

Mukhanov et al. (2011) "Hybrid Semiconductor-Superconductor Fast-Readout Memory for Digital RF Receivers" IEEE Transactions on Applied Superconductivity, 21(3): 797-800.

Murphy et al. (2017) "Nanoscale superconducting memory based on the kinetic inductance of asymmetric nanowire loops" New J. Phys. 19: 063015.

Nagasawa et al. (1995) "A 380 ps, 9.5 mW Josephson 4-Kbit RAM operated at a high bit yield" IEEE Transactions on Applied Superconductivity, 5(2): 2447-2452.

Stojchfvska et al. (2014) "Ultrafast Switching to a Stable Hidden Quantum State in an Electronic Crystal" Science, 344(6180): 177-180.

Tolpygo et al. (2016) "Superconductor Digital Electronics: Scalability and Energy Efficiency Issues" Low Temperature Physics, 42(5): 361-378.

Tulina et al. (2016) "Nd2-xCexCuO4-y/Nd2-xCexOy boundary and resistive switchings in mesoscopic structures on base of epitaxial Nd1.86Ce0.14CuO4-yfilms", Physica C, 527:41-45.

Van Duzer et al. (2013) "64-kb Hybrid Josephson-CMOS 4 Kelvin RAM With 400 ps Access Time and 12 mW Read Power" IEEE Transactions on Applied Superconductivity, 23(3): 1700504.

Vaskivskyi et al. (2015) "Controlling the metal-to-insulator relaxation of the metastable hidden quantum state in 1T-TaS2" Science Advances, 1(6): e1500168.

Vaskivskyi et al. (2016) "Fast electronic resistance switching involving hidden charge density wave states" Nature Communications, 7(11442).

Ye et al. (2014) "Spin-transfer switching of orthogonal spin-valve devices at cryogenic temperatures" Journal of Applied Physics, 115(17): 17C725.

Yoshida et al. (2015) "Memristive phase switching in two-dimensional 1T-TaS2 crystals" Sci. Adv. 1(9): e1500606.

Zhao et al. (2017) "A nanocryotron comparator can connect single-flux-quantum circuits to conventional electronics" Superconductor Science and Technology, 30(4): 044002.

Zhao et al. (2018) "A compact superconducting nanowire memory element operated by nanowire cryotrons" Supercond. Sci. Technol. 31(3): 035009.

* cited by examiner

MEMORY DEVICE AND METHOD FOR ITS OPERATION

FIELD OF THE INVENTION

The present invention relates to the technical field of memory devices and methods for the operation of such devices. The operation of memory devices at cryogenic temperatures enables the implementation of superconducting-based electronic devices and particularly, although not exclusively, to superconducting-based memory devices.

BACKGROUND

In the view of the inventor, there is a need for a fast, low switching energy, cryogenic memory that is scalable, allows flexible architectures and is compatible with superconducting flux quantum electronics. Holmes et al. (2013) describe the requirements for fast and efficient operation of superconducting computers, emphasizing the need for fast efficient memory. The scalability and energy efficiency issues were discussed by Tolpygo (2016).

An example of a known proposal for a memory solution is described by Zhao et al. (2018), who presented a superconducting nanowire memory element operated by nanowire cryotrons.

Furthermore, various hybrid devices have been developed in the last decade. Ye et al. (2018) described a spin-transfer switching of orthogonal spin-valve devices at cryogenic temperatures. A hybrid superconducting-magnetic memory device using competing order parameters was described by Baek et al. (2014). Gingrich et al. described controllable 0-π Josephson junctions containing a ferromagnetic spin valve (Gingrich et al. 2016). Larkin et al. (2018) describe a ferromagnetic Josephson switching device with high characteristic voltage. A 380 ps, 9.5 mW Josephson 4-Kbit RAM that operated at a high bit yield was described by Nagasawa et al. (1995). A nanoscale superconducting memory based on the kinetic inductance of asymmetric nanowire loops was described by Murphy et al. (2017).

Hybrid CMOS memory has been described most relevantly by Mukhanov et al. (2011) and Van Duzer et al. (2013). Mukhanov et al. (2011) described a hybrid semiconductor-superconductor fast memory based on CMOS. Van Duzer et al. (2013) described a 64-kb hybrid Josephson-CMOS 4 Kelvin RAM with 400 ps access time and 12 mW read power.

Brenner, Roy, Shah and Bezryadin showed the dynamics of the superconducting nanowires shunted with an external resistor (Brenner et al. 2012). In their publication Baranov, Balanov and Kabanov theoretically showed the effect of shunt resistance on the dynamics of the resistive state in thin superconducting channels (Baranov et al. 2013). The effective resistance of a superconducting nanowire was described by Buh et al. (2015). Madan et al. (2018) presented optical switching of a superconducting nanowire resistance.

SUMMARY OF THE INVENTION

The present invention has been devised in light of the above considerations. The present invention is based in part on the inventor's realisation that it would be possible to implement a useful memory device that combines a switchable resistive element with a superconductor element to control the switching of the switchable resistive element.

It is acknowledged that switchable resistive materials are known. Indeed, the present invention has been devised based in part on the inventor's previous work in this area. For example, resistance switching of such materials induced by light pulses or electrical pulses is described in U.S. Pat. No. 9,589,631 B2. Resistance switching of such materials induced by electrical pulses is described in U.S. Pat. No. 9,818,479 B2.

Stojchevska et al. (2014) disclose low-temperature resistance switching in a charge density wave (CDW) material ($1T\text{-}TaS_2$), by ultrashort laser pulses. Vaskivskyi et al. (2015) described low-temperature switching and resistivity relaxation by electrical pulses. In 2014 Stojchevska et al. and later in 2016 Vaskivskyi et al. showed switching by electrical pulses from 1 second to <50 ps (Stojchevska et al., 2014; Vaskivskyi et al., 2016), demonstrating write, read and erase operations. Such operation of a resistive switching device allows the device to be considered to be a "memristive" device in the sense that the device exhibits a resistance (detectable in a read operation) dependent on a previous electrical pulse applied to the device (e.g. a write or erase operation). The device disclosed by Vaskivskyi et al. (2016) showed scaling of switching voltage with device dimensions, enabling the device to be tailored to specific applications by appropriate choice of dimensions.

Yoshida et al. (2015) described memristive behavior in $1T\text{-}TaS_2$ with liquid ion electrode gating.

A superconducting-nanowire three-terminal electrothermal device (nanocryotron) was described by McCaughan et al. (2014) that uses a constriction (choke) to induce current-induced heating in a narrow superconducting channel to modulate the supercurrent in a thin-film superconducting device with a gate, a drain, and a source terminal, all connected contiguously with no junctions.

Accordingly, in a first preferred aspect, the present invention provides a memory device comprising:

a switchable resistive element comprising an active material, the active material being switchable, by current injection, between first and second values of electrical resistivity $\rho_1$ and $\rho_2$ at the same temperature, wherein $\rho_1$ is different to $\rho_2$; and a superconductor element connected electrically in parallel with the switchable resistive element, the superconductor element being operable so that at least part of the superconductor element is switchable from a superconducting state to a non-superconducting state, wherein the memory device is operable so that, when the superconductor element is switched from the superconducting state to the non-superconducting state, a current injection is provided through the switchable resistive element capable of switching the switchable resistive element between said first and second values of electrical resistivity.

In a second preferred aspect, the present invention provides a method of operation of a memory device according to the first aspect, the method including the steps:

providing a temperature environment for at least the superconductor element to allow at least part of the superconductor element to be in a superconducting state; and switching at least part of the superconductor element from the superconducting state to a non-superconducting state and thereby causing a current injection to flow through the switchable resistive element capable of switching the switchable resistive element between said first and second values of electrical resistivity.

The first and/or second aspect of the invention may have any one or, to the extent that they are compatible, any combination of the following optional features.

Preferably the first and second resistive states of the active material represent first and second memory states of the switchable resistive element. As will be well understood, the first and second resistive states can be assigned binary values of 0 and 1, or 1 and 0, respectively, in order to store one bit of information.

The memory device may either be a volatile memory device or a non-volatile memory device.

The superconductor element may be in the form of a layer formed on an underlying substrate. For example, the superconducting element may be in the form of a film (thin film or thick film). The superconductor element may be patterned to form a required shape. For example, the superconductor element may be in the form of a nanowire. Here "nanowire" is intended to convey the requirement that at least one transverse dimension of the superconductor element is in the sub-micron range. More preferably, two orthogonal transverse dimensions (e.g. thickness and width) of the superconductor element may be in the sub-micron range.

The superconductor element may be in the form of, or have, a narrow channel. Such a channel may for example include a constriction region. The constriction region may be adapted to switch from a superconducting state to a non-superconducting state, in preference to the remainder of the superconductor element, when the current flowing in the constriction exceeds the local critical current density or when the temperature of the constriction exceeds the critical temperature. In effect, the constriction region acts as a region of weakness for the current-carrying capability of the superconductor element.

Switching into a non-superconducting state in the superconductor element causes the formation of a resistive region. Depending on the materials properties and dimensions of the resistive region (and the superconducting element as a whole), the resistive region may exhibit a resistance in the $k\Omega$ range. For example, suitable resistances of at least 0.1 $k\Omega$, at least 1 $k\Omega$ or at least 10 $k\Omega$ may be exhibited.

The switchable resistive element may be in the form of a layer formed on an underlying substrate. This may be the same substrate as for the superconducting element. For example, the switchable resistive element may be in the form of a film (thin film or thick film). The switchable resistive element may be patterned to form a required shape. For example, the switchable resistive element may be in the form of a nanowire.

Preferably the superconductor element and the switchable resistive element are formed in a stacked arrangement. In the stacked arrangement, the superconductor element may be fabricated on top of the switchable resistive element, or vice versa, forming a parallel device.

The superconductor element may be a two terminal device with positive and negative terminals (i.e. a source and a drain only, in analogy to transistor devices). Alternatively, the superconductor element may be a three-terminal device. Suitable three terminal superconducting elements are known, such as those in which an additional gate (in the form of a narrow choke) is used to control the current in the main part of the superconductor element between source and drain terminals. An example of such a three terminal superconducting element is disclosed and referred to as a "nano-cryotron" ("nTron") device by McCaughan et al. (2014).

Turning now to the switchable resistive element, it is considered that suitable switching of resistivity states can take place with a current injection in the form of a current pulse with a duration of less than 1 µs, more preferably less than 100 ns, more preferably less than 50 ns, more preferably less than 20 ns.

$\rho_1$ can be expressed as X times $\rho_2$. Preferably, X is at least 5, at least 10, at least 100 or more preferably at least 1000. As will be understood, provided that the difference between $\rho_1$ and $\rho_2$ can be determined reliably, then the memory device is able to store information based on that difference.

The materials used for the active material of the switchable resistive element may be, but not limited to 1T-TaS$_2$, a layered dichalcogenide, a chalcogenide or an oxide material. Suitable chalcogenide materials will now be set out in more detail. The active material may be formed from a layered dichalcogenide material. Suitable materials include 1T-TaS$_2$ and 1T-TaS$_x$Se$_{2-x}$. It is at present considered that any material which supports multiple charge ordered states may be used in the present invention, including rare earth tritellurides. For example, it is considered at present that many materials support suitable macroscopic quantum states providing the required different resistivity states (such as CDW ordering). Suitable materials include: MX$_3$ compounds (such as NbSe$_3$, TaS$_3$, NbS$_3$, ZrTe$_3$, etc.); transition metal tetrachalcogenides (MX$_4$)$_n$Y (such as (TaSe$_4$)$_2$I, (NbSe$_4$)$_3$I, (NbSe$_4$)$_{10}$I$_3$); blue and purple bronzes (K$_{0.3}$MoO$_3$, Rb$_{0.3}$MoO$_3$, Tl$_{0.3}$MoO$_3$); molybdenum sub-oxides Mo$_x$O$_y$, such as Mo$_4$O$_{11}$; O organic CDW systems such as Bechgaard-Fabre salts and TCNQ salts.

The thickness of the active material is preferably less than 100 µm, e.g. less than 10 µm, more preferably less than 1 µm and still more preferably 500 nm or less. The active material may have a thickness of 1 nm or more, more preferably 5 nm or more, more preferably 10 nm or more. Corresponding dimensional ranges may also apply independently to the width of the active material.

The temperature of operation of the device is primarily determined by the critical temperature Tc of the superconductor element. Suitable operating temperatures may therefore be 100K or lower, more typically for present materials 40K or lower. Temperatures of 20K or lower may be advantageous for some embodiments.

Suitable materials for the superconductor element are known. For example, the superconductor element may comprise Nb, NbN or Al. At the temperature of operation, the superconductor is typically a type II superconductor. The device is preferably operated at a temperature of not greater than ⅔ times Tc (expressed in K) of the superconductor.

Preferably, the current injection to the switchable resistive element is achieved at relatively low voltage. The preferred arrangement is for the current injection to be achieved at transistor logic levels. For example, preferably the current injection is achieved at voltage of 20V or less, more preferably 12V or less, more preferably 10V or less, more preferably 8V or less, more preferably 6V or less, more preferably 4V or less, more preferably below 1V. In terms of electric field strength, preferably the current injection is achieved at electric field strength of 200 kV/cm or less, more preferably 50 kV/cm or less, more preferably 30 kV/cm or less, more preferably 25 kV/cm or less, more preferably 12 kV/cm or less, more preferably 15 kV/cm or less, more preferably about 10 kV/cm.

Preferably the current injection to the device is provided, in use, by an external circuit. The current injection may either be in a pulsed mode or in a continuous mode and may be achieved by control of an applied current to the device or by control of an applied voltage across the device.

The invention includes the combination of the aspects and preferred features described except where such a combination is clearly impermissible or expressly avoided. Further optional features of the invention are set out below.

SUMMARY OF THE FIGURES

Embodiments and experiments illustrating the principles of the invention will now be discussed with reference to the accompanying figures in which.

DETAILED DESCRIPTION OF THE INVENTION

Aspects and embodiments of the present invention will now be discussed with reference to the accompanying figures. Further aspects and embodiments will be apparent to those skilled in the art. All documents mentioned in this text are incorporated herein by reference.

In a general overview, it can be seen that the preferred embodiments of the invention provide a hybrid superconducting memory device that combines a superconductor element in parallel with a switchable resistive element. The preferred embodiments are characterized by ultrafast switching speed, two- or three-terminal operation, scalability, low switching energy (due to the ability to use low-energy memristive elements), low-temperature operation, ease of integration, simple 2-element circuit design and compatibility with superconducting electronics, particularly superconducting flux-quantum electronics.

Figure 1:
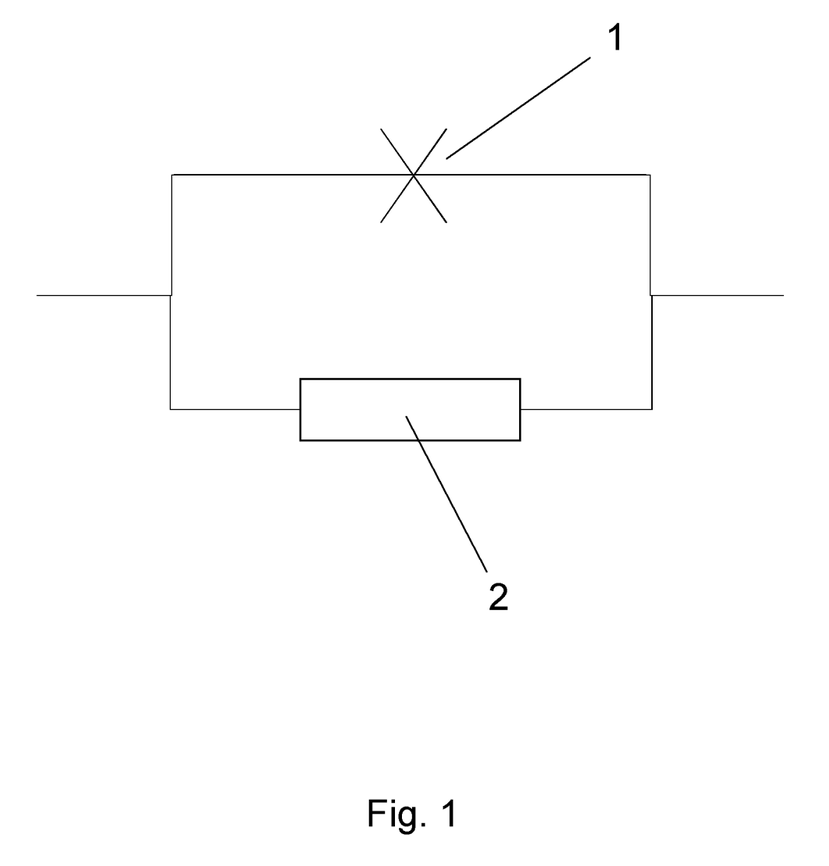
FIG. 1. An effective simplified circuit diagram of the 'parallelotron' or 'p-tron' device, including superconductor element 1 and switchable resistive element 2 in physical contact or connected electrically via external circuit to the superconductor element.

The basic device in one embodiment is composed of a superconductor element on top of a switchable resistive element, effectively forming a narrow superconducting channel shunted with a controllable resistance shunt. An effective circuit diagram of the device is shown in FIG. 1. The shunt resistance is $R_s$ which is switchable (non-volatile), or a non-linear element that acts as a variable or non-linear shunt resistance.

Figure 2:
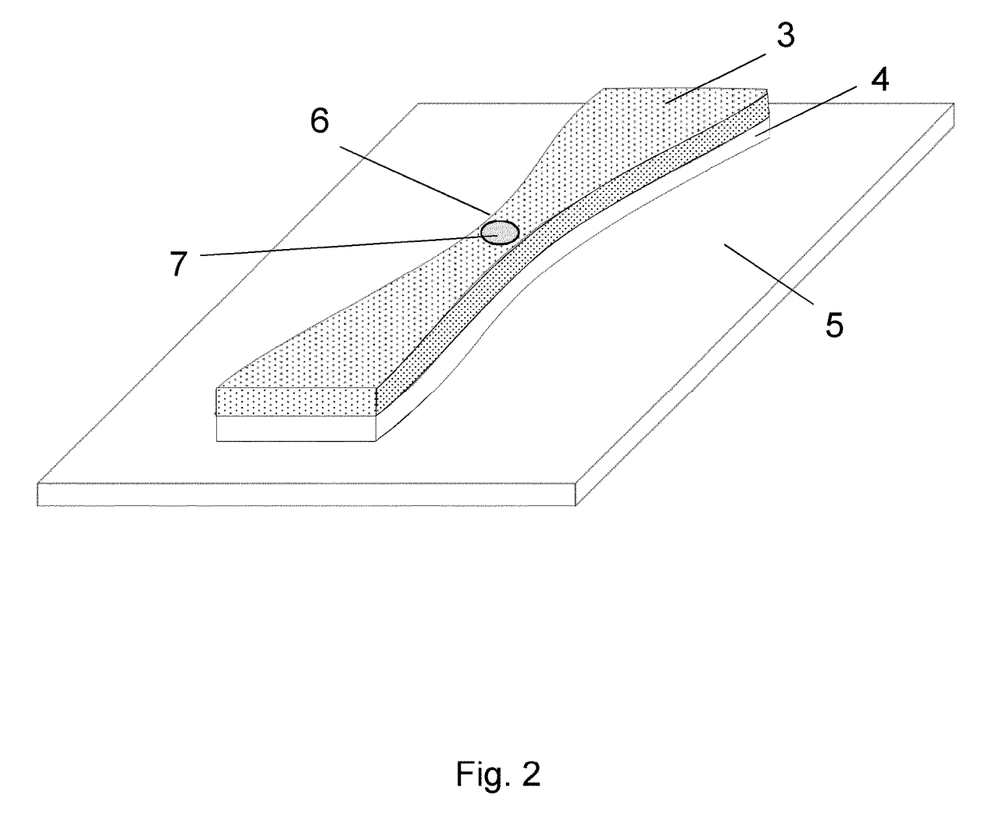
FIG. 2. Schematic of a superconductor element 3 fabricated on top of a switchable resistive element 2 forming a parallel device on substrate 5. A constriction 6 in the superconductor element 3 serves to locally increase the current density and create a hot spot 7 where the current density is sufficient to cause a superconductor-to-normal state transition which then causes part of the current to flow through the switchable resistive element 4.

Typically, a constriction is fabricated in the superconducting channel such that the current density is higher at a selected region in the channel as shown in FIG. 2.

The Principle of Operation of the Device

The device consists of a narrow superconductor channel deposited on a memristive non-volatile CDW material described previously (U.S. Pat. No. 9,818,479 (B2)), thereby forming a device with parallel current paths ('parallelotron'). The memristive non-volatile CDW material or memristor may otherwise be referred to as a switchable resistive element. The memory device is connected such that a supercurrent j passes through the superconducting channel. When the supercurrent exceeds a critical value j, it causes the superconductor to go normal and become resistive with the formation, for example, of a thermal hot spot. When the superconducting channel goes to the normal state, a voltage appears across the memristor and part of the current $j_m$ starts to flow in parallel through the memristive material below. Above a certain threshold current $j_w$, or threshold applied voltage $V_w$, the memristor is caused to undergo a transition to the low-resistance state which constitutes the Write operation, placing the device into a low-shunt resistance state.

The reverse transition from the low resistance state to the high resistance state of the shunt memristor (the Erase operation) is caused when the current exceeds a certain but different value of critical current $j_{c2}$, changing the shunt resistance to a high value. A geometrical constriction in the memristive material may be used to confine and tailor the current path through the memristive material. The detailed operation of a preferred embodiment of the device is described below.

Operation of the CDW Memristor without Superconducting Nanowire

Figure 3:
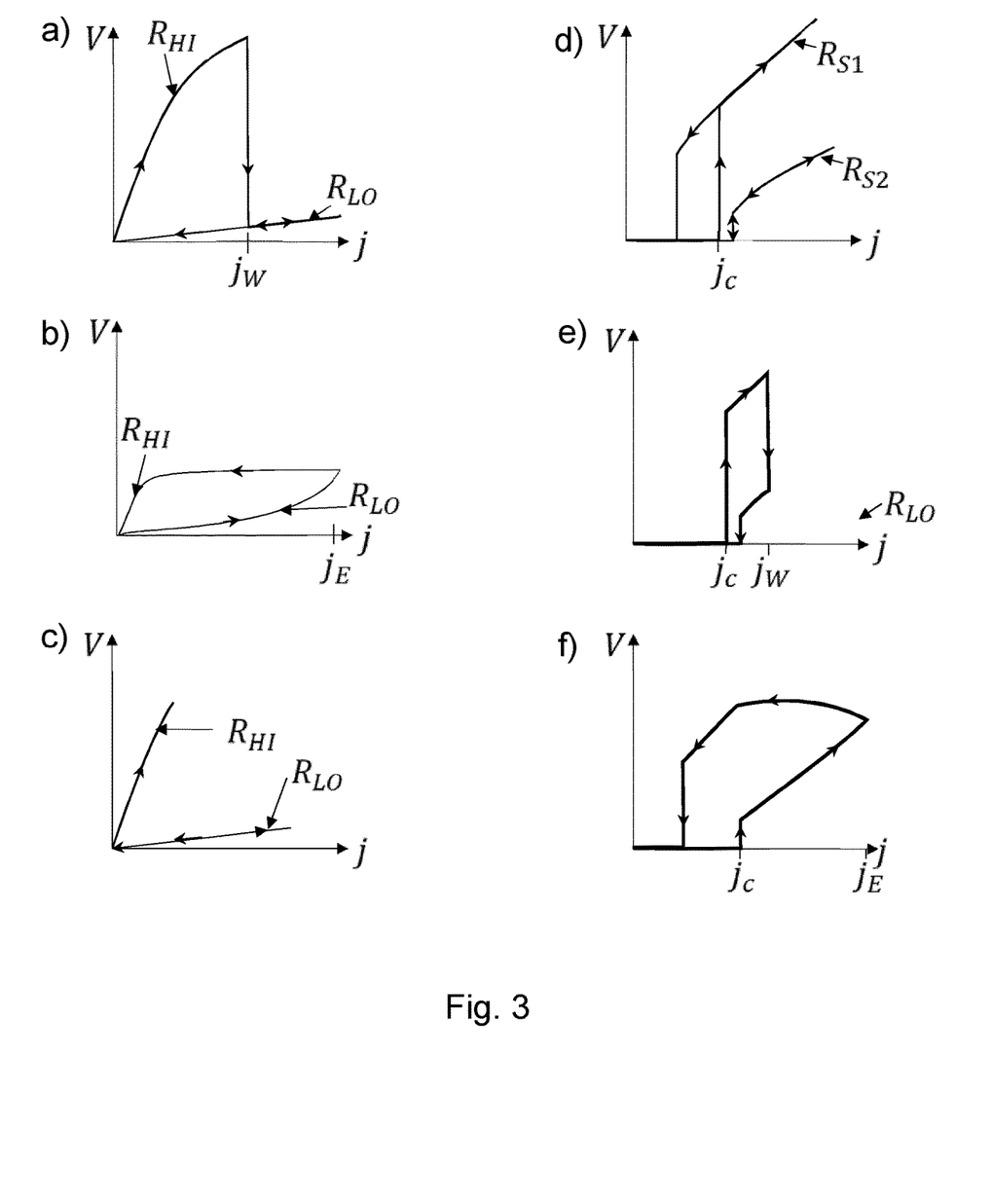
FIG. 3. The behaviour of a switchable resistive element according to Vaskivskyi et al. (2016). a) The V-j curve for a switchable resistive element Write cycle. b) The V-j curve for the Erase cycle. c) The V-j curves corresponding to the $R_{HI}$ and $R_{LO}$ states of the switchable resistive material. d) The V-j curves $R_{S1}$ and $R_{S2}$ for a superconductor nanowire with high ($R_{HI}$) and low ($R_{LO}$) shunt resistances respectively, $j_c$ is the superconducting critical current. e) The Write cycle for a nanowire weak link with a switchable resistive element switching from $R_{HI}$ to $R_{LO}$ at or above a threshold current $j_w$. f) The Erase cycle for a nanowire weak link with a switchable resistive element shunt switching from $R_{LO}$ to $R_{HI}$ at or above a threshold current $j_E$.
Figure 4:
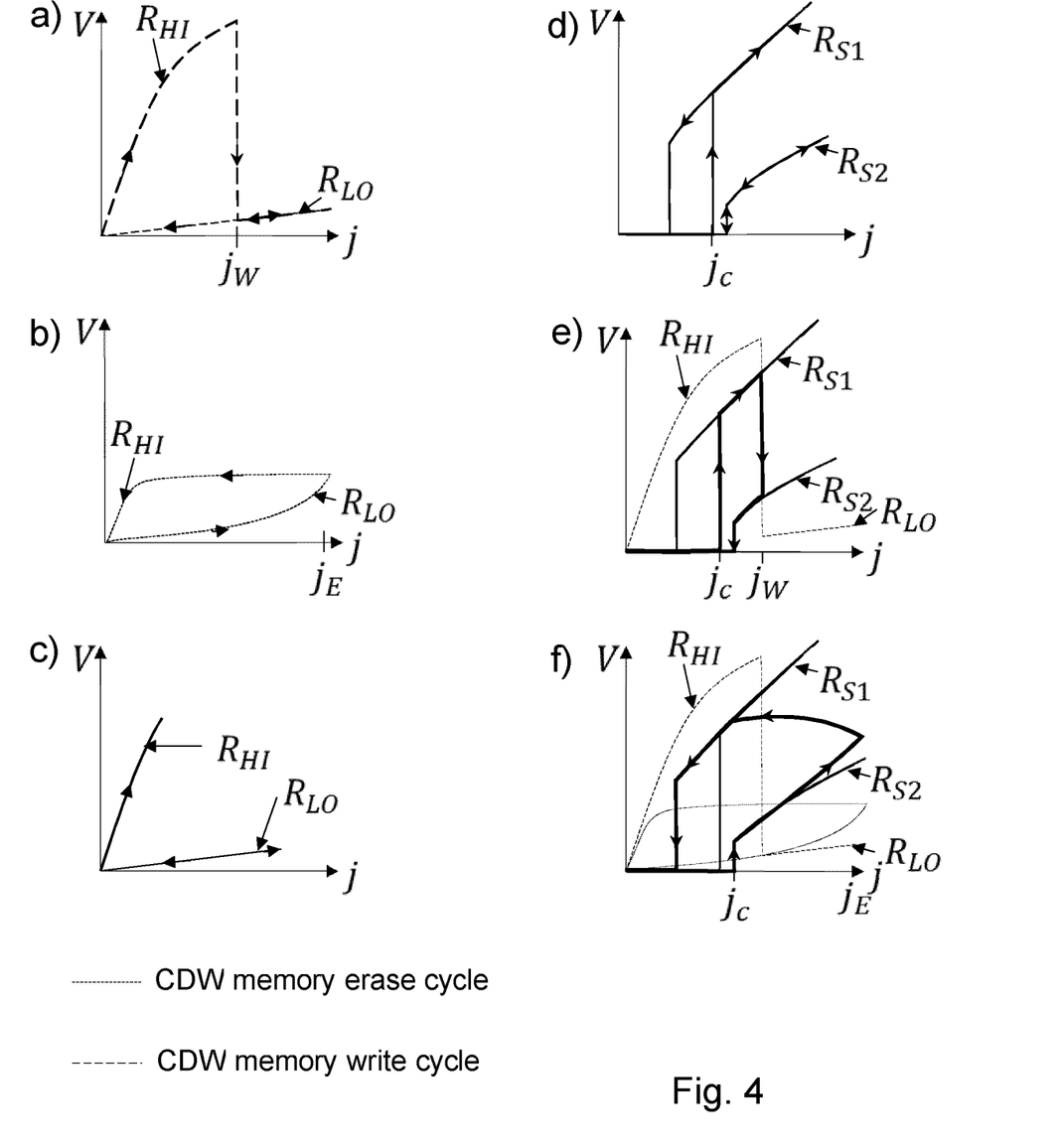
FIG. 4. Supplements FIG. 3 to show a) The V-j curve for a switchable resistive element Write cycle. b) The V-j curve for the Erase cycle. c) The V-j curves corresponding to the $R_{HI}$ and $R_{LO}$ states of the switchable resistive material. d) The V-j curves $R_{S1}$ and $R_{S2}$ for a superconductor nanowire with high ($R_{HI}$) and low ($R_{LO}$) shunt resistances respectively e) The V-j curves for; the Write cycle for a switchable resistive element, a superconductor nanowire with resistance $R_{S1}$ and $R_{S2}$ with high ($R_{HI}$) and low ($R_{LO}$) shunt resistances respectively, the Write cycle for a nanowire weak link with a switchable resistive element switching from $R_{HI}$ to $R_{LO}$ at or above a threshold current $j_w$.

The operation cycles are shown in FIGS. 3 $a$-$c$ and FIGS. 4 $a$-$c$, describing the Write, Erase and read cycles of a CDW memristor, as described by Vaskivskyi et al. (2016).

In the Write cycle (FIG. 3$a$ and FIG. 4$a$) the device is initially in a high resistance state $R_{HI}$, in which the current-voltage (j-V) curve is approximately described by $j=j_0 \exp(V/V_0)$, where $j_0$ and $V_0$ are constants (Vaskivskyi et al., 2016). Above a threshold current $j_w$, the resistance drops to a low resistance state $R_{LO}$, remaining in this state indefinitely, i.e. as long as the memristor remains in the low-resistance state as determined by external factors, such as the state lifetime, or temperature.

The Erase cycle (FIG. 3$b$ and FIG. 4$b$) involves increasing the current in the low-resistance state $R_{LO}$ of the CDW memristor until an Erase threshold is reached ($j_E$). Upon reducing the current, the original high-resistance state $R_{HI}$ is recovered.

Read operations in the $R_{HI}$ and $R_{LO}$ states are shown in FIG. 3$c$ and FIG. 4$c$.

Operation of the Superconducting Nanowire Channel without CDW Memristor

The operation of the nanowire channel shunted by a fixed resistance $R_s$ as shown in FIG. 1 is described by Brenner et al. (2012) and is shown in FIG. 3$d$ and FIG. 4$d$ for two different values of $R_{s1}$ and $R_{s2}$. For $R_s > R_{critical}$, where $R_{critical}$ is some critical resistance value, the device shows hysteretic V-I behavior. When $R_s<R_{critical}$, the device shows no hysteresis and a lower overall resistance, with a higher critical current value.

Operation of the Superconducting Nanowire and CDW Memristor in Parallel (Parallelotron)

a) The Write Cycle

In the initial state, the CDW memristor is in the $R_{HI}$ state, and the superconducting channel in the $R_{S1}$ state. As the supercurrent increases, it follows the trajectory shown in FIG. 3e, 4e. At a critical value $j_{c1}$, the superconductor element becomes resistive and follows the path up to the point where the current through the memristor exceeds $j_W$. At this point the CDW memristor switches to $R_{LO}$ (FIG. 4e), effectively changing the shunt resistance, thus causing the superconducting channel to revert to the $R_{S2}$ state (FIGS. 3d, e and 4d, e), b) The Erase Cycle The device is in the initial state $R_{S2}$. Increasing the current causes it to follow the curve $R_{S2}$ until $j_E$ is reached through the CDW memristor shunt (FIG. 3 d, f and FIG. 4 d, f). Upon reducing the current, the CDW memristor reverts to the high resistance state $R_{HI}$ and the superconducting channel reverts to the state $R_{S1}$ (FIGS. 3 d, f and FIG. 4 d, f).

The values of critical currents and switching thresholds can be varied by appropriate design, thickness, widths of either channel.

In another embodiment, the two-terminal device is extended to a three-terminal configuration incorporating a superconductor on top of a memristive material, whereby an additional narrow choke is used to control the supercurrent in the narrow nanowire channel as demonstrated, but not limited to, the nano-cryotron (nTron) device described by McCaughan et al. (2014).

The nTron described by McCaughan et al. (2014) is a thin-film superconducting device consisting of a gate nanowire and a channel nanowire with its two ends referred to as a drain and source. The intersection between the gate and the channel is referred as the choke. The choke is placed perpendicularly to where the channel is narrowest and the current density is the highest to maximize the sensitivity of the nTron. Current entering the gate terminal switches the phase of the choke from the superconducting to the resistive state when the local critical current density is exceeded. Breaking the superconductivity in a nanowire leads to the diffusion of hot quasiparticles and a growth of resistance. In the present invention, when the nTron channel switches to a resistive state, a current injection will flow through the memristor.

In a further embodiment of the device, the memristor and superconducting channel are not in direct contact, but are in electrical contact as shown in FIG. 1, such that they are connected on the chip, the substrate or the contacts are configurable outside the chip.

In a further configuration, an array of memory devices substantially as described above can be set out, for example with a set of word lines and bit lines in a cross-bar configuration.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

REFERENCES

A number of publications are cited above in order to more fully describe and disclose the invention and the state of the art to which the invention pertains. Full citations for these references are provided below. The entirety of each of these references is incorporated herein.

D. S. Holmes et al. Energy-Efficient Superconducting Computing—Power Budgets and Requirements, IEEE transactions on Appl. Supercon. 23, 1701610 (2013).

S. K. Tolpygo. Superconductor Digital Electronics: Scalability and Energy Efficiency Issues. Low Temperature Physics, vol. 42, Issue 5, pp. 361-378, (2016).

Q.-Y. Zhao et al. A compact superconducting nanowire memory element operated by nanowire cryotrons. Supercond. Sci. Technol. 31 (2018).

L. Ye et al. Spin-transfer switching of orthogonal spin-valve devices at cryogenic temperatures. Journal of Applied Physics 115, 17C725 (2014).

B. Baek et al. Hybrid superconducting-magnetic memory device using competing order parameters. Nature Communications volume 5, Article number: 3888 (2014).

E. C. Gingrich et al. Controllable 0-π Josephson junctions containing a ferromagnetic spin valve. Nature Physics volume 12, pages 564-567 (2016).

T. I. Larkin et al. Ferromagnetic Josephson switching device with high characteristic voltage. Appl. Phys. Lett. 100, 222601 (2012).

S. Nagasawa et al. A 380 ps, 9.5 mW Josephson 4-Kbit RAM operated at a high bit yield. IEEE Transactions on Applied Superconductivity (Volume: 5, Issue: 2, June 1995).

A. Murphy et al. Nanoscale superconducting memory based on the kinetic inductance of asymmetric nanowire loops. New J. Phys. 19, 063015 (2017).

O. A. Mukhanov et al. Hybrid Semiconductor-Superconductor Fast-Readout Memory for Digital RF Receivers. IEEE Transactions on Applied Superconductivity (Volume: 21, Issue: 3, June 2011).

T. Van Duzer et al. 64-kb Hybrid Josephson-CMOS 4 Kelvin RAM With 400 ps Access Time and 12 mW Read Power. IEEE Transactions on Applied Superconductivity (Volume: 23, Issue: 3, June 2013).

M. W. Brenner et al. Dynamics of superconducting nanowires shunted with an external resistor. Phys. Rev. B 85, 224507 (2012).

V. V. Baranov et al. Dynamics of resistive state in thin superconducting channels. Physical review. B, Condensed matter 87(17):174516 (2013).

J. Buh et al. Control of switching between metastable superconducting states in δ-MoN nanowires. Nat Commun. 6: 10250 (2015).

I. Madan et al. Nonequilibrium optical control of dynamical states in superconducting nanowire circuits. Science Advances. Vol. 4, no. 3. (2018).

U.S. Pat. No. 9,589,631 B2

U.S. Pat. No. 9,818,479 B2

L. Stojchevska et al. Ultrafast Switching to a Stable Hidden Quantum State in an Electronic Crystal. Science. Vol. 344, Issue 6180, pp. 177-180. (2014).

I. Vaskivskyi et al. Controlling the metal-to-insulator relaxation of the metastable hidden quantum state in $1T-TaS_2$. Science Advances. Vol. 1, no. 6. (2015).

I. Vaskivskyi et al. Fast electronic resistance switching involving hidden charge density wave states. Nature Communications volume 7, Article number: 11442 (2016).

M. Yoshida et al. Memristive phase switching in two-dimensional 1T-TaS2 crystals. Sci Adv. 1(9). (2015).

A. N. McCaughan et al. A Superconducting-Nanowire Three-Terminal Electrothermal Device. Nano Lett., 14 (10), pp 5748-5753, (2014).

The invention claimed is:

1. A memory device comprising:
a switchable resistive element comprising an active material, the active material being switchable, by current injection, between first and second values of electrical resistivity $\rho_1$ and $\rho_2$ at the same temperature, wherein $\rho_1$ is different to $\rho_2$; and
a superconductor element connected electrically in parallel with the switchable resistive element, the superconductor element being operable so that at least part of the superconductor element is switchable from a superconducting state to a non-superconducting state,
wherein the memory device is operable so that, when the superconductor element is switched from the superconducting state to the non-superconducting state, a current injection is provided through the switchable resistive element capable of switching the switchable resistive element between said first and second values of electrical resistivity.

2. A memory device according to claim 1 wherein the first and second resistive states of the active material represent first and second memory states of the switchable resistive element.

3. A memory device according to claim 1 wherein the memory device is a volatile memory device.

4. A memory device according to claim 1 wherein the memory device is a non-volatile memory device.

5. A memory device according to claim 1 wherein the superconductor is in the form of a nanowire or a narrow channel.

6. A memory device according to claim 1 wherein the superconductor element includes a constriction region adapted to switch to a non-superconducting state in preference to the remainder of the superconductor element.

7. A memory device according to claim 1 wherein the superconductor element and the switchable resistive element are formed in a stacked arrangement.

8. A memory device according to claim 1 wherein the superconductor element is a two terminal device.

9. A memory device according to claim 1 wherein the superconductor element is a three terminal device.

10. A memory device according to claim 1 wherein the active material of the switchable resistive element is selected from the group consisting of: $1T-TaS_2$, a layered dichalcogenide, a chalcogenide, and an oxide material.

11. A memory device according to claim 1 wherein the current injection is provided, in use, by an external circuit.

12. A method of operation of a memory device, the memory device comprising:
a switchable resistive element comprising an active material, the active material being switchable, by current injection, between first and second values of electrical resistivity $\rho_1$ and $\rho_2$ at the same temperature, wherein $\rho_1$ is different to $\rho_2$; and
a superconductor element connected electrically in parallel with the switchable resistive element, the superconductor element being operable so that at least part of the superconductor element is switchable from a superconducting state to a non-superconducting state, the method including the steps:
providing a temperature environment for at least the superconductor element to allow at least part of the superconductor element to be in a superconducting state; and
switching at least part of the superconductor element from the superconducting state to a non-superconducting state and thereby causing a current injection to flow through the switchable resistive element capable of switching the switchable resistive element between said first and second values of electrical resistivity.

13. A method according to claim 12, wherein at least part of the superconductor element is switched from a superconducting state to a non-superconducting state by current density.

14. A method according to claim 12, wherein at least part of the superconductor element is switched from a superconducting state to a non-superconducting state by temperature.

15. A method according to claim 12 wherein the current injection is in a pulsed mode.

16. A method according to claim 12 wherein the current injection is in a continuous mode.

17. A method according to claim 12 wherein the current injection is achieved by control of an applied current to the device or by control of an applied voltage across the device.

* * * * *